US008151236B2

(12) United States Patent
Su et al.

(10) Patent No.: US 8,151,236 B2
(45) Date of Patent: Apr. 3, 2012

(54) STEINER TREE BASED APPROACH FOR POLYGON FRACTURING

(75) Inventors: Qing Su, Sunnyvale, CA (US); Yongqiang Lu, Beijing (CN); Charles C. Chiang, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 724 days.

(21) Appl. No.: 12/017,025

(22) Filed: Jan. 19, 2008

(65) Prior Publication Data

US 2009/0187876 A1 Jul. 23, 2009

(51) Int. Cl.
*G06F 19/50* (2006.01)
(52) U.S. Cl. ............... 716/124; 716/50; 716/53; 716/54; 716/55; 716/122; 716/123; 716/125; 716/131; 716/136; 716/139
(58) Field of Classification Search ............... 716/7–11, 716/19–21, 50, 118–125, 53–55, 131, 136, 716/139
See application file for complete search history.

(56) References Cited

U.S. PATENT DOCUMENTS

| 5,930,500 | A * | 7/1999 | Scepanovic et al. ............ 716/13 |
| 6,324,674 | B2 * | 11/2001 | Andreev et al. ................ 716/12 |
| 6,728,946 | B1 | 4/2004 | Schellenberg et al. |
| 6,770,403 | B2 | 8/2004 | Park et al. |
| 7,022,439 | B2 | 4/2006 | Luttrell |
| 2004/0123260 | A1 * | 6/2004 | Teig et al. ......................... 716/7 |

OTHER PUBLICATIONS

Arora, S., "Approximation schemes for NP-hard geometric optimization problems: a survey," Math. Program., Ser. B 97:43-69 (2003).
Asano, T. et al., "Partitioning a Polygonal Region into Trapezoids," Journal of ACM, 33(2):290-312, 1986.
Bloecker M., et al., "Metrics to Assess Fracture Quality for Variable Shaped Beam Lithography," Proc. of SPIE vol. 6349 (2006) pp. 63490Z-1 to 63490Z-10.
Chu, C., "Flute: Fast Lookup Table Based Wirelength Estimation Technique," International Conference on Computer-Aided Design, pp. 696-701, 2004.
Du, D-Z. et al., "Chapter 7, Adaptive Partition," Design and Analysis of Approximation Algorithms (Lecture Notes), 2002, 33 pp.
Garey, M.R. et al., "The rectilinear Steiner tree problem is NP-complete," Siam J. App. Math., vol. 32(4), Jun. 1977, pp. 826-834.
Gelsey, A., et al., "A Search Space Toolkit," Proceeding of 11th Conference on Artificial Intelligence for Applications, pp. 117-123, 1995.
Guibas, L.J. et al., "On computing all northeast nearest neighbors in the L1 metric," Information Processing Letters, 17:219-223, 1983.
Hanan, M., "On Steiner's problem with rectilinear distance," J. Siam Appl. Math., vol. 14(2):255-265, 1966.

(Continued)

*Primary Examiner* — Nghia Doan
(74) *Attorney, Agent, or Firm* — Haynes Beffel & Wolfeld LLP; Warren S. Wolfeld

(57) ABSTRACT

Roughly described, a method for mask data preparation is described, for use with a preliminary mask layout that includes a starting polygon, the vertices of the starting polygon including I-points (vertices of the starting polygon having an interior angle greater than 90 degrees), including steps of developing a rectilinear partition tree on at least the I-points of the starting polygon, and using the edges of the partition tree to define the partition of the starting polygon into sub-polygons for mask writing.

38 Claims, 13 Drawing Sheets

OTHER PUBLICATIONS

Ho, J-M., et al., "A New Approach to the Rectilinear Steiner Tree Problem," 26th ACM/IEEE Design Automation Conference, Paper 11.2, 1989, pp. 161-166.

Ho, J-M. et al, "New Algorithms for the Rectilinear Steiner Tree Problem," IEEE Transactions on Computer-Aided Design, vol. 9(2):185-193, 1990.

Kahng, A.B. et al., "A New Class of Iterative Steiner Tree Heuristics with Good Performance," IEEE Transactions on Computer-Aided Design, vol. 11(7):893-902, 1992.

Kahng, A.B., et al., "Yield- and Cost-Driven Fracturing for Variable Shaped-Beam Mask Writing," 24th Annual BACUS Sumposium on Photomask Technology, Proceedings of SPIE vol. 5567:360-371, 2004.

Khang, A.B., et al., "Fast Yield-Driven Fracture for Variable Shaped-Beam Mask Writing,"Proc. SPIE Symposium on Photomask and NGL Mask Technology XIII (Photomask Japan), Apr. 2006, (Morihisa Hoga ed.) vol. 6283,62832R (2006), pp. 2R-1-2R-10.

Lingas, A., et al., "Minimum Edge Length Partitioning of Rectilinear Polygons," Proc. 20th Allerton Conf. on Communication, Control, and Computing, University of Illinois, pp. 53-63, 1982.

Mitchell, J.S.B., "Guillotine Subdivisions Approximate Polygonal Subdivisions: A Simple New Method for the Geometric k-MST Problem," Proceedings of the 7th Annual ACM-SIAM Symposium on Discrete Algorithms, pp. 402-408, 1996.

Nakao, H., et al., "A New Figure Gracturing Algorithm for Variable-Shaped EB Exposure-Data Generation," Electronics and Communications in Japan, Part 3, vol. 83(8), 2000, pp. 87-102. Translated from Denshi Joho Tsushin Gakkai Ronbunshi, vol. J80-A, No. 12, Dec. 1997, pp. 2103-2116.

Ohtsuki, T., "Minimum dissection of rectilinear regions," Proc. ISCS, vol. 3, pp. 1210-1213, Rome, 1982, IEEE 82CH1681-6.

O'Rourke, J., et al., "Partitioning Orthogonal Polygons into Fat Rectangles," Proc. of 13th Canadian Conf. on Comp. Geom., pp. 133-136, 2001.

Zhou, H., "Efficient Steiner Tree Construction Based on Spanning Graphs," IEEE Transactions on Computer-Aided Design of Integrated Circuits and Systems, vol. 23(5):704-710, 2004.

Chapter 24, Minimum Spanning Trees, Introduction to Algorithms, T.H. Cormen et al., editors, The MIT Press with McGraw-Hill Book Company, 1990, pp. 499-511.

Chapter 23.2, The algorithms of Kruskal and Prim, Introduction to Algorithms (2nd ed.), T.H. Cormen et al., editors, The MIT Press with McGraw-Hill Book Company, 2001, pp. 567-579.

Mar. 31, 2009 International Search Report for PCT/US2008/081070.

* cited by examiner

STARTING POLYGON

GRAPH G (ONLY
CONNECTIONS FROM
a AND b ARE SHOWN)

MINIMAL SPANNING
TREE, I-POINTS ONLY

SEPARABLE MINIMAL
SPANNING TREE
WITH R-POINTS
ADDED

RECTILINEAR
STEINER TREE

RECTILINEAR
STEINER MINIMAL
TREE WITH
REDUNDANT EDGES
REMOVED

FINAL POLYGON
PARTITION

STEINER TREE BASED APPROACH FOR POLYGON FRACTURING

BACKGROUND

The invention relates to mask data preparation for integrated circuit manufacturing, and more particularly it relates to an innovative tree-based approach for fracturing of layout polygons into sub-polygons (more usefully, into trapezoids) for mask writing.

As device technology continues to scale below the 65 nm process node, the number of geometries added by the heavy application of resolution enhancement techniques (RET) continues to grow. In part, this is a consequence of 193 nm lithography having to suffice for tighter geometries with every new process node. As a result, issues associated with mask data preparation (MDP) such as complexity, run time, and quality are growing in severity. As one major and core step in MDP, polygon fracturing (partitioning) converts the complex polygons generated by the layout process, into non-overlapping trapezoids suitable for mask writing. The partitioning run time and quality directly impacts the cost, integrity, and quality of the written mask.

For modern MDP, the main criteria for a high quality polygon partitioning solution are (1) to minimize the number of small unprintable geometries known as slivers; (2) to minimize the exposed boundary length of such slivers if unavoidable; and (3) to avoid CD (critical dimension) slicing cut lines. In most typical approaches, cut line based heuristics are used to solve the polygon partitioning problem. These heuristics need to go through iterations of local cut line evaluation, correction, and re-evaluation. Hence the cut line evaluation order and iteration depth can significantly impact the final result quality. For some examples, the global quality of the resulting partition is difficult to control.

The ever-increasing demand for a high quality of partitions requires a significant improvement over current algorithms. To meet all the above criteria, current cut line based heuristics are becoming more difficult to apply and the results are frequently trapped in local optima. In addition, each cut line based heuristic is usually designed and tailored toward a specific optimization objective such as minimizing the cut line length, or minimizing the figure count. If it becomes necessary to change the optimization objective, then the entire algorithm typically must be changed. The flexibility and portability of such changes for these cut line based methods are low.

There is a significant need, therefore, for new and better algorithms for achieving high quality polygon partitions for mask data preparation.

SUMMARY

According to the invention, roughly described, a method for mask data preparation is described, for use with a preliminary mask layout that includes a starting polygon, the vertices of the input (later referred to as "starting") polygon including I-points being those of the starting polygon vertices with an interior angle strictly greater than 90 degrees, comprising the steps of developing a rectilinear partition tree on at least the I-points of the starting polygon, and using the edges of the partition tree to define the partition of the starting polygon into sub-polygons for mask writing.

DETAILED DESCRIPTION

Figure 1A:
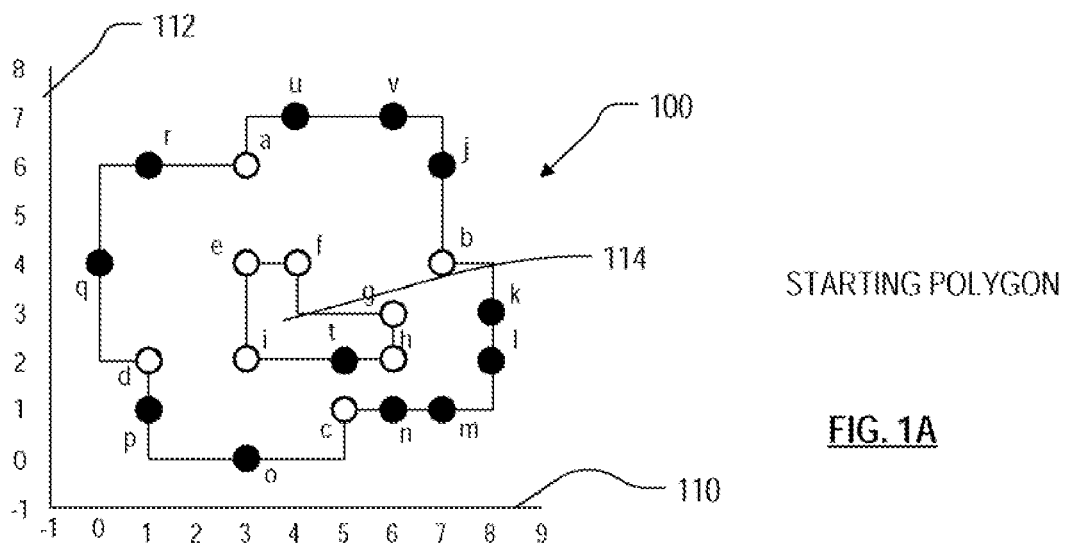
FIGS. 1A-1G (collectively FIG. 1) illustrate various stages of a polygon partitioning example according to features of the invention.

The following detailed description is made with reference to the figures. Preferred embodiments are described to illustrate the present invention, not to limit its scope, which is defined by the claims. Those of ordinary skill in the art will recognize a variety of equivalent variations on the description that follows.

Overview of Polygon Fracturing Approach

The innovative approach to solving the polygon partitioning problem described herein is based on formulating a variant Steiner minimal tree which is referred to from here on as the minimal partition tree (MPT). The inflection vertices of the original polygon and some additional points intersected by candidate cut lines and polygon boundaries, are used as terminal nodes of the tree. By constructing a specially formulated Steiner tree on these tree terminals, a partition is obtained whose cut lines are suggested by the resulting tree edges.

Thus the technique achieves optimal polygon partitioning results by constructing an optimal tree. Embodiments are described herein in which all the candidate cut lines, which are considered as tree edges in tree approach, can be simultaneously considered during the tree construction. Hence the processing order and iteration depth will not affect the final quality of results as in traditional methods. In addition, since the new approach inherits the strong theoretical foundation from existing Steiner tree research, several mature and efficient algorithms are available that can be applied to solve the reformulated Steiner tree problem. Some of these are described herein, and others will be apparent to the reader. Moreover, the new approach permits relatively easy changes in optimization objectives. Often such changes will not need to change any of the algorithm framework. As an example, if the objective is changed from minimizing the total cut line length of a partition to maximizing the minimal cut line length, the underlying Steiner tree to be formulated can simply be changed from a Steiner minimal tree to a min-max Steiner tree. Finally, embodiments of the new approach can operate with high speed, greatly improving the quality of polygon partitioning results without a significant CPU runtime penalty.

In the main embodiments described herein, one goal is to minimize the number of slivers. A sliver, as used herein, is a small dimension figure that is difficult to print on a mask because of its narrowness relative to the resolution of the mask writing equipment. It is known that the number of slivers can be minimized by targeting a partition whose rectangles have an aspect ratio as close to unity as possible, and it is known that the latter objective is equivalent to minimizing the total cut line length of the partition. Therefore, the class of optimization problems to which the polygon partitioning problem belongs is known traditionally as minimum cut length rectangular partition (MCLRP) problems. The embodiments described herein modify the minimum cut length criteria in a manner that also permits incorporation of other objectives and requirements of the mask-making environment.

Overview of System Flow

Figure 2:
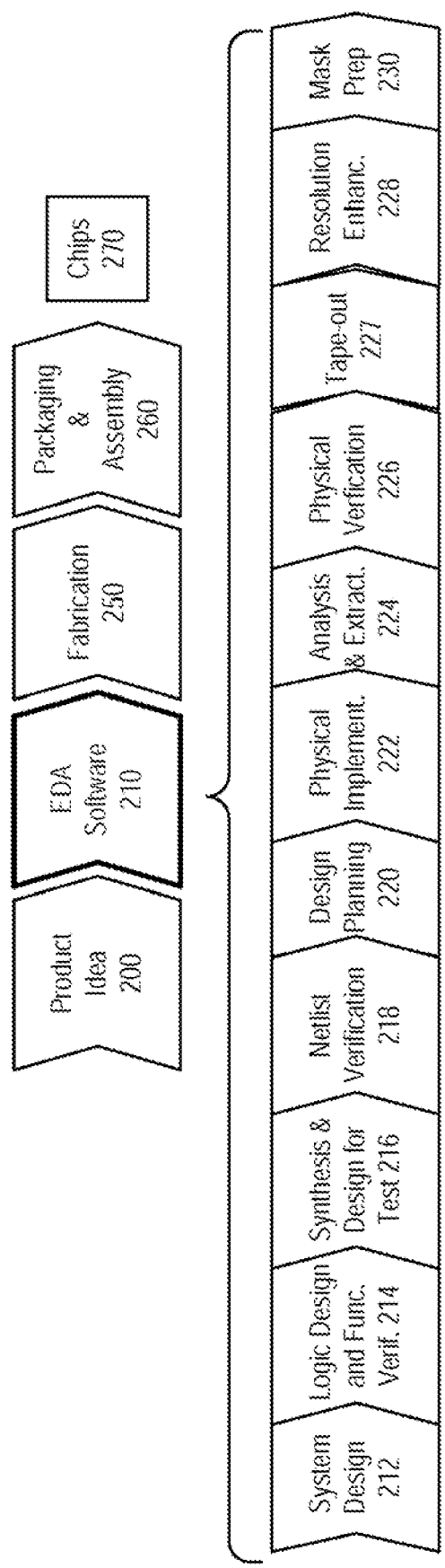
FIG. 2 shows a simplified representation of an illustrative integrated circuit design flow.

FIG. 2 shows a simplified representation of an illustrative digital integrated circuit design flow. At a high level, the process starts with the product idea (step 200) and is realized in an EDA (Electronic Design Automation) software design process (step 210). When the design is finalized, the fabrication process (step 250) and packaging and assembly processes (step 260) occur resulting, ultimately, in finished integrated circuit chips (result 270).

The EDA software design process (step 210) is actually composed of a number of steps 212-230, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 210) will now be provided.

System design (step 212): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 214): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 216): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 218): At this step, the netlist is checked for compliance with timing constraints and for correspondence with the VHDL % Verilog source code. Example EDA software products from Synopsys, Inc. that can be used at this step include Formality, PrimeTime, and VCS products.

Design planning (step 220): Here, an overall floor plan for the chip is constructed and analyzed for timing and top-level routing. Example EDA software products from Synopsys, Inc. that can be used at this step include Astro and IC Compiler products.

Physical implementation (step 222): The placement (positioning of circuit elements) and routing (connection of the same) occurs at this step. Example EDA software products from Synopsys, Inc. that can be used at this step include the Astro and IC Compiler products.

Analysis and extraction (step 224): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 226): At this step various checking functions are performed to ensure correctness for: manufacturing, electrical issues, lithographic issues, and circuitry. Example EDA software products from Synopsys, Inc. that can be used at this step include the Hercules product.

Tape-out (step 227): This step provides the "tape-out" data for production of masks for lithographic use to produce finished chips. Example EDA software products from Synopsys, Inc. that can be used at this step include the CATS(R) family of products.

Resolution enhancement (step 228): This step involves geometric manipulations of the layout to improve manufacturability of the design. Example EDA software products from Synopsys, Inc. that can be used at this step include Proteus, ProteusAF, and PSMGen products.

Mask preparation (step 230): This step includes both mask data preparation and the writing of the masks themselves. Certain aspects of the invention herein can take place during this step.

Figure 3:
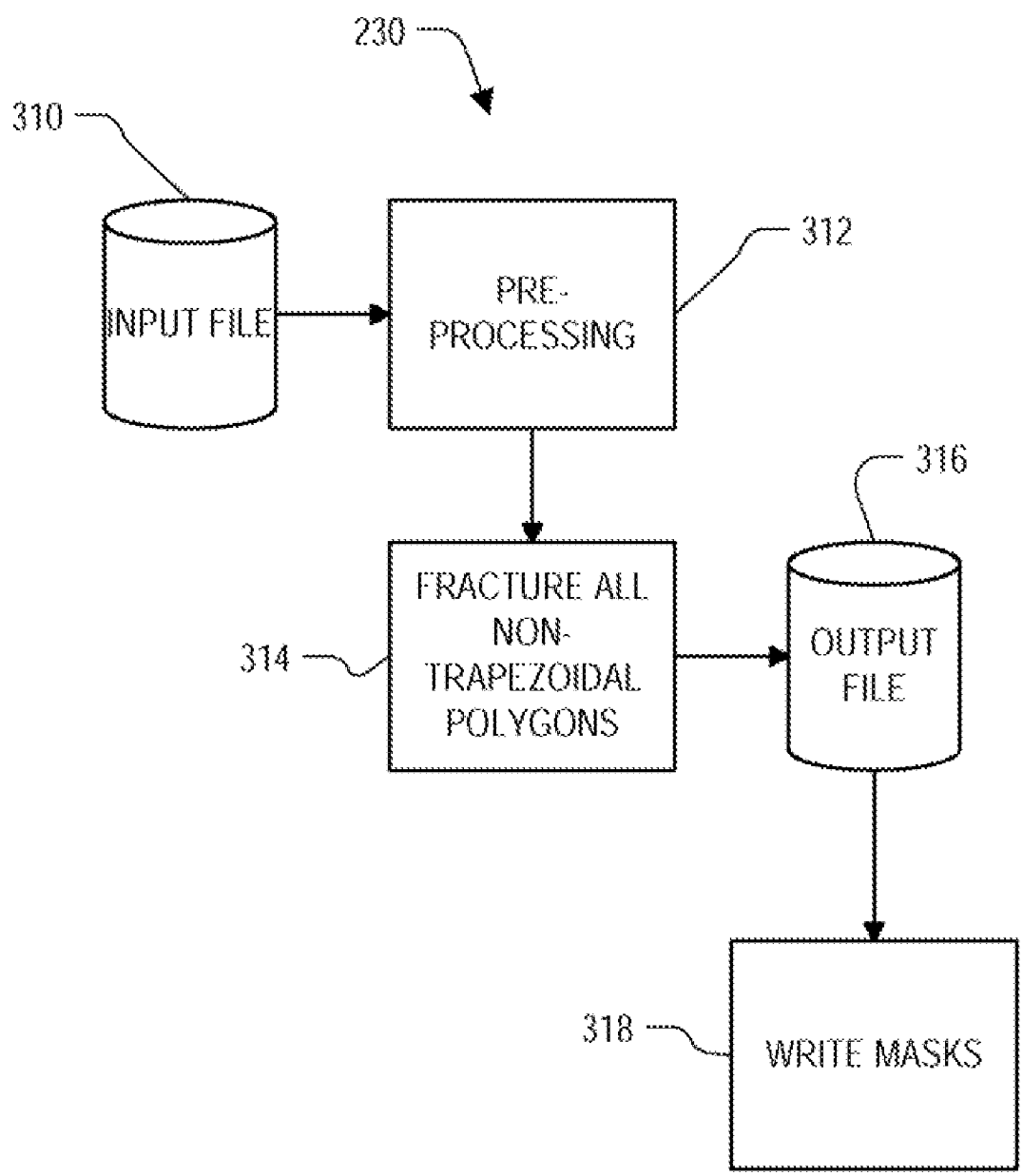
FIG. 3 is a flowchart illustrating portions of the mask preparation step of FIG. 2.

FIG. 3 is a flowchart illustrating portions of mask preparation step 230. As with all flowcharts herein, it will be appreciated that many of the steps in FIG. 3 can be combined, performed in parallel or performed in a different sequence without affecting the functions achieved. The input file 310 to the mask preparation step 230 is typically provided by a design house, but could instead be generated by the same organization that is preparing the mask data. The input file 310 typically arrives in any of several standard formats, such as GDS, OASIS, CREF, etc. The file describes the layout of the circuit design in the form of a mask definition for each of the masks to be generated. Each mask definition defines a plurality of polygons, many of which can be quite complex. Any resolution enhancement (RET) has already been performed by this point in the process, as has physical verification.

In step 312 the input polygons are pre-processed for the fracturing process. This step can include such manipulations as flattening, exploding, sizing and healing of the input polygons. The resulting polygons are then partitioned in step 314, and then written to an output file 316. All incoming polygons that are not already in the required shape (trapezoidal in one embodiment, rectangular in another embodiment) are partitioned in step 314. (As used herein, a trapezoid is a polygon having four sides, at least two of which are parallel to each other. A rectangle is a special case of a trapezoid.) The polygon descriptions in the output file 316, all of which do have the required shape, are then provided to a mask writing service (which may be in-house) for exposing the masks. In one embodiment the polygon descriptions are written to an output file 316 may be stored in memory within or outside of the systems implementing the fracturing step 314, or as another example may be stored on computer readable mediums such as hard drives, CD-ROMs and DVDs. Also, they may be transmitted over a communication network such as interconnected computer systems and communication links to the mask writing service. The communication links may be wireline links, optical links, wireless links, and combinations thereof or any other mechanisms for communication of information.

In step 316, a mask is fabricated for each layer of the integrated circuit layout using the sub-polygons created in step 314. The mask writing process can be any type of lithographic process for fabricating semiconductor chips, including processes that make use of, deep-ultraviolet (DUV) radiation, extreme ultraviolet (EUV) radiation, X-rays, and electron beams. The writing method can be raster-based, or can use a variable shaped beam (VSB), or can be any other method. In one embodiment, the mask writing process proceeds as follows. On a quartz substrate, a Cr/CrO2 layer is formed by sputtering. A photoresist coating is then formed over the Cr/CrO2 layer. Using E-Beam or Laser lithography equipment, the desired pattern is written onto the surface of the photoresist layer. The patterns are the trapezoids output from the fracturing process described above. Using a chemical developer, the photoresist is removed either where the photoresist was exposed or where it was not exposed by the lithography equipment, depending on whether a positive or negative process is being used. Using either a dry or a wet etching technique, the now-exposed Cr/CrO2 layer is etched to reveal the quartz surface. The area still covered by photoresist is unaffected. The remaining photoresist is then removed using a stripping process, followed by cleaning and drying steps. At this stage, the photomask surface is composed of dark and clear areas, the dark areas being those quartz areas still covered by Cr/CrO2 and the clear areas being those areas of quartz no longer covered by Cr/CrO2. Typically, these steps are followed by critical dimension measurements performed over the dark or clear space patterns. Positional accuracy of key patterns are also measured. Defects are identified and any necessary repair work is performed. There then follows a cleaning step, and then a pellicle is mounted over the finished side of quartz plate in order to prevent potential contamination.

Terminology

Figure 1B:
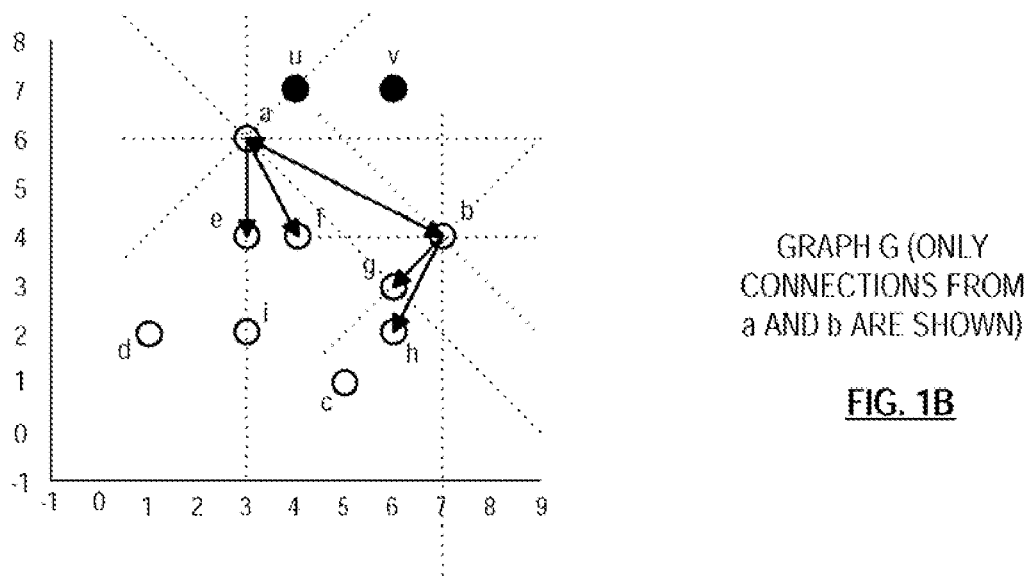

Before describing the polygon partitioning method in detail, it will be useful to establish some terminology as used herein. FIG. 1G illustrates a starting polygon (also sometimes referred to herein as a "subject" polygon) on which a partition has been made. The starting polygon is drawn in the figure on a grid defined by axes 110 and 112, but the axes are actually arbitrary. It is most useful for the discussion herein if the axes are defined in dependence upon the polygon. Specifically, as used herein, one axis is taken as any line parallel to a boundary segment of the starting polygon, and the other axis is taken as any line perpendicular to the first axis.

In FIG. 1G, the starting polygon is defined by solid lines. "Cut-lines", shown as broken lines, have been added for the partition. The starting polygon is an example of a "rectilinear polygon", which as used herein is a polygon with all the boundaries being axis parallel. While aspects of the invention apply equally to non-rectilinear polygons (i.e. polygons having at least one boundary not parallel to an axis), rectilinear starting polygons are used in most examples described herein.

As used herein, an inflection vertex (or I-vertex or I-point for short) of a polygon is a vertex of the polygon whose interior angle is greater than 90°. If the polygon includes a hole, the region inside the hole is considered herein to be part of the exterior, not interior of the polygon. Thus the following points in FIG. 1G constitute I-points: a, b, c, d, e, f, g, h and i. In a rectilinear polygon, all I-vertices have an interior angle of 270°.

A rectilinear partitioning on a polygon (or rectangular partitioning for a rectilinear polygon), as these terms are used herein, is a division of the polygon into a set of disjoint rectangles or trapezoids whose union equals the polygon, such as the rectangles separated by the broken lines in FIG. 1G. "Cut-lines", as the term is used herein, are the line segments in the polygon interior that divide the polygon into sub-polygons (rectangles or trapezoids for a rectilinear partitioning). As used herein, "cut-lines" includes not only those that start and end on boundaries of the original polygon (such as line segments ae, fb, hn, tc and id in FIG. 1G), but also those that terminate inside the polygon (such as Sg in FIG. 1G). In rectilinear partitioning, the cut-lines are all parallel to the x-axis or y-axis. In an embodiment that permits non-rectilinear partitions, a cut-line need not lie parallel to an axis and the resulting sub-polygons of the partition need not be rectangular.

If both endpoints of a cut line are I-vertices of the starting polygon, then the cut-line is sometimes referred to herein as a "chord". Otherwise the cut line is sometimes referred to herein as a "cutting ray". Examples of chords in FIG. 1G are ae, fb and id. Examples of cutting rays in FIG. 1G are Sg, hn and tc. If cutting rays are drawn from every I-vertex in the two rectilinear directions across the interior of the polygon, if they do not meet another I-point, they will intersect the nearest polygon boundary at what are referred to herein as ray crossing vertices or R-vertices or R-points. Points t and n in FIG. 1G are examples of R-points. It can be seen that in a rectangular partitioning, the sum of the number of chords that can be drawn from any given I-point and the number of cutting rays that can be drawn from the given I-point, is always 2. Neither, one, or both of the cut-lines are chords and the remainder are cutting rays. No I-point can have more than two R-points. As used herein, the I-point from which a cutting ray is drawn to a particular R-point is sometimes referred to herein as the parent I-point of the particular R-point, and the particular R-point is sometimes referred to herein as the child.

In the embodiments described herein, the cut lines rather than the resulting sub-polygons are the critical components for the polygon partitioning problem. All the cut lines, the endpoints and the intersecting points of these cut lines can be considered to form a graph which is referred to herein as a partition graph (or partition in short). That is, as used herein, a "partition" is the entire set of cut lines with their endpoints. The "cost" of a partition herein is generally measured by the total cut line length, as modified by other objectives. If the graph has no cycles, the corresponding partition is referred to as a acyclic partition; otherwise the graph-corresponding partition is referred to as a cyclic partition. More particularly, an "anchored partition", as used herein, means a partition with each of its cut lines having at least one endpoint being an inflection vertex.

A Hanan Grid on a Polygon (HGP), as used herein, is a set of X and Y gridlines constructed on a polygon such that all vertices of the polygon are crossings of the grid and all gridlines intersect at least one of the polygon vertices. Additionally, all gridlines of an HGP either coincide with a boundary segment of the polygon or are completely interior to the polygon. Thus an HGP includes all the rectilinear boundaries of the polygon.

A "graph", as used herein, is a set of nodes connected together by edges. A "tree", as used herein, means a connected graph with no cycles. There is no requirement herein that any particular node of a tree be designated as a root node. A "Spanning Tree", as used herein, is a graph which is a tree and which passes through all the vertices of the original graph. A graph can have many different spanning trees. A Minimal Spanning Tree (MST) is that Spanning Tree of a graph in which the edges of the tree satisfy some predefined minimum total length criteria. In embodiments described herein, the total length of a Spanning Tree is the sum of the L1 lengths of all the edges of the Spanning Tree. The L1 length of an edge (also called the Manhattan length of the edge) is the distance between its endpoints in the X direction plus the distance between its endpoints in the Y direction. L1 length differs from L2 length (also called Euclidean length or distance), which is the length of a straight line from one endpoint to the other. A Separable Minimal Spanning Tree (SMST), as used herein, is a Minimal Spanning Tree in which no two non-adjacent tree edges have their bounding boxes touching or intersecting each other. As described in more detail elsewhere herein, separability guarantees that the construction of a Steiner tree from an SMST is independent of tree edge processing order. Furthermore, it allows the complexity of constructing a Steiner tree from it to be as low as being linear to the number of spanning tree edges.

A "Steiner Tree", as used herein, is a tree connecting all the nodes of a graph. Unlike a Spanning Tree, however, a Steiner Tree can (but is not required to) also include additional nodes, not in the original graph. The additional nodes are sometimes referred to herein as Steiner vertices or Steiner points. As used herein, a Steiner Tree need not be a Steiner Minimal Tree. A "Steiner Minimal Tree" (SMT), as used herein, is that Steiner Tree of a graph in which the edges of the tree satisfy some predefined cost minimization criteria. In embodiments described herein, the cost of a particular Steiner Tree depends not only on the total L1 length of its edges, but also on its level of compliance with various desired objectives. A "Partition Tree", as used herein, is a tree used for partitioning a polygon as described in more detail below. Preferably it comprises a variant rectilinear Steiner Minimal Tree, but that is not essential in all embodiments of the invention. The preferred form of Partition Tree is sometimes referred to herein as a Minimal Partition Tree (MPT), the features and characteristics of which are described herein.

Polygon Fracturing

FIGS. 4-10 together constitute a flowchart illustrating methods according to aspects of the invention for partitioning a starting polygon (step 314, FIG. 3). The flowcharts will be described with reference to the partitioning of an example starting polygon, specifically polygon 100 shown in FIG. 1A. Initially, it can be seen that polygon 100 consists of a plurality of boundary segments (shown in solid lines) connecting pairs of starting polygon vertices (shown as corners of the polygon). Polygon 100 includes a hole 114. Polygon 100 has an interior, being the region inside the outer boundary and outside the hole 114. Polygon 100 includes inflection vertices (I-points) a, b, c, d, e, f, g, h and i, shown in the figure with open dots. Also shown in FIG. 1A are the R-points j, k, l, m, n, o, p, q, r, u and v of polygon 100, shown in the figure with solid dots. While many of the techniques described herein apply to both rectilinear and non-rectilinear polygons, Polygon 100 is a rectilinear polygon since all its boundaries are parallel to one or the other of the axes 110, 112.

Figure 4:
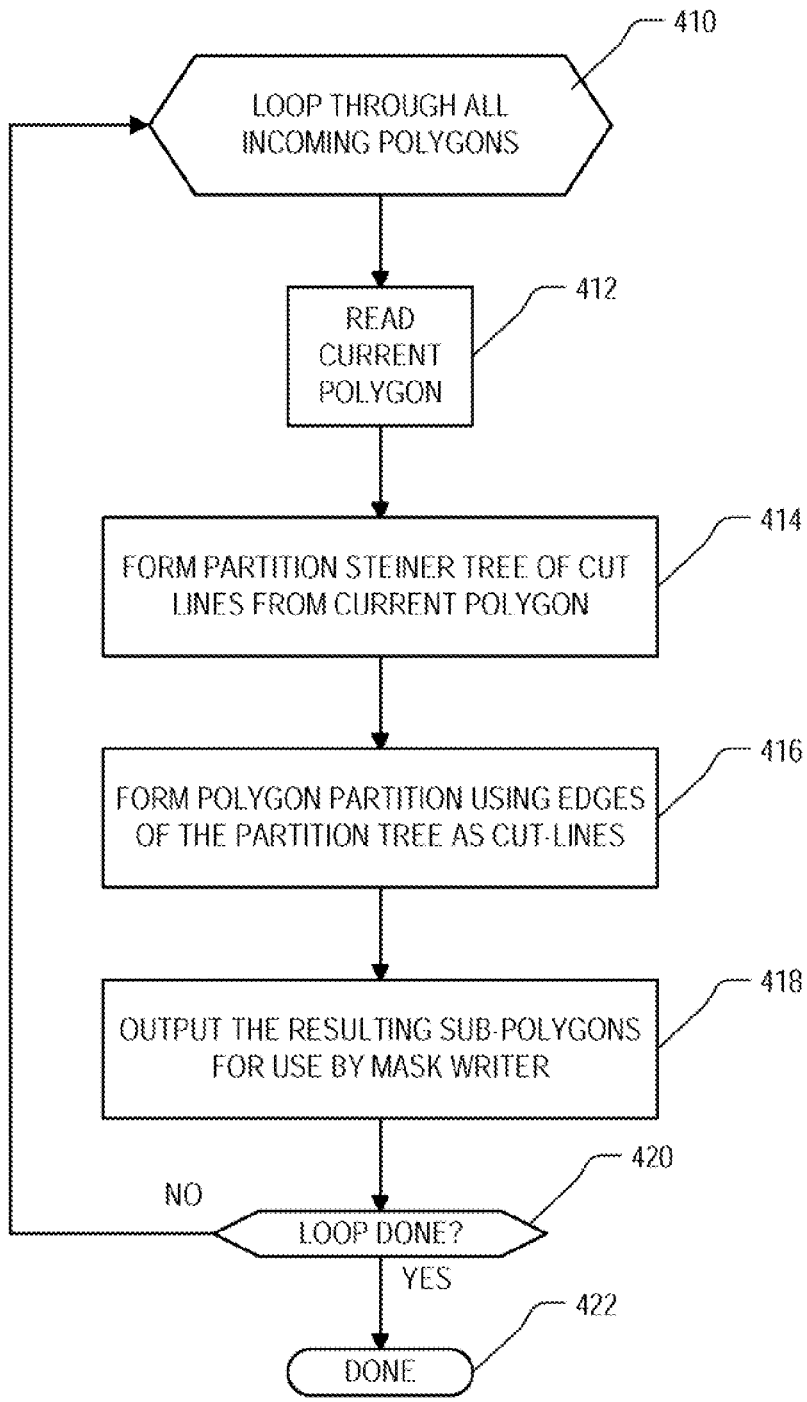
FIGS. 4-10 together constitute a flowchart illustrating methods partitioning a starting polygon.

Referring to FIG. 4, the overall process is shown. It begins with a loop 410 through all of the incoming polygons. In step 412, the current polygon, for example polygon 100, is read. In step 414 a Partition Tree is developed from the cut-lines of the current polygon. Preferably the Partition Tree has been optimized, for example in a manner described herein, but that is not required in some of the broadest aspects of the invention. An example of a Partition tree developed from the polygon 100 is the tree shown in FIG. 1F. It can be seen that this tree includes all the I-points of the polygon 100, with at least one edge connected to each of the I-points. The Partition tree of FIG. 1F also includes two of the R-points n and t, and also includes one Steiner point S. The Partition tree of FIG. 1F is a rectilinear Steiner tree, although not all embodiments of the invention require that it be a Steiner tree.

In step 416, the starting polygon is partitioned by transferring the edges of the Partition tree onto the starting polygon as cut-lines. This is shown in FIG. 1G for the polygon 100. In the embodiment shown, all the edges of the Partition tree are used as cut-lines in the final partition except to the extent they coincide with boundaries of the starting polygon (in which case no cut is required). The cut-lines, which are ae, bf, gS, hn, ct and di, are indicated with broken lines. It can be seen that the boundaries and cut-lines shown in FIG. 1G define six sub-polygons (in the present embodiment all rectangles) of the starting polygon 100. It can be seen further that all sides of all of the sub-polygons lie on either a boundary of the starting polygon (those sides indicated in the figure with solid lines) or an edge of the partition tree (those sides shown in broken lines) or both (such as side ai and side dt).

In step 418, the sub-polygons are output individually for use by the mask writer to make the mask. In an embodiment in which all the sub-polygons are required to be rectangles, the sub-polygons can be output in a manner that identifies the X and Y positions of any two diagonally opposite vertices. In an embodiment in which the sub-polygons can be trapezoids (such as where a boundary of a sub-polygon, the trapezoid, coincides with a diagonal boundary segment of the starting polygon), the sub-polygons (trapezoids) can be output in a manner that identifies the X and Y positions of all four vertices. In an embodiment in which the sub-polygons can have non-trapezoidal shapes, other ways can be used to identify the vertices and edges of the sub-polygons.

In step 420 it is determined whether there are additional polygons to fracture. If so, then the process returns to step 410 to fracture the next starting polygon. If not, then polygon fracturing step 314 completes (step 422).

Preferred Method for Developing Partition Tree

There are many ways to develop a Partition tree on a starting polygon. In one embodiment, all possible rectilinear cut-rays are drawn from each of the I-points to their respective R-points, and the Partition Tree is given by the complete set of I-points, R-points and cut-rays. In another embodiment, such a Partition Tree is in some sense optimized before transferring it to the starting polygon. For example, an exhaustive search can be performed on the initial Partition Tree for an optimal subset of the cut-rays. Many other methods of developing the Partition Tree will be apparent to the reader.

In a preferred embodiment, the Partition Tree is a cost-minimized rectilinear Steiner Minimal Tree, referred to herein as a Minimal Partition Tree (MPT). It is a variant Steiner minimal tree which offers a global and systematic algorithm for obtaining an optimal solution. In addition, the MPT inherits a solid theoretical foundation from existing Steiner tree research. Therefore there are several mature and efficient algorithms available that can be applied to solve the reformulated Steiner tree problem. Furthermore, by using cost minimization rather than simply total tree edge length minimization, other quality metrics such as sliver control can be incorporated into the optimization objectives. In addition, using a Steiner tree as basis of the polygon partitioning approach makes changing optimization objectives an easy task and does not necessarily require changing algorithms. An example is that if the objective is changed from minimizing the total cut length to minimizing the maximum cut length, the variant Steiner tree can simply be switched from a Steiner minimal tree to a min-max Steiner tree.

Figure 5:
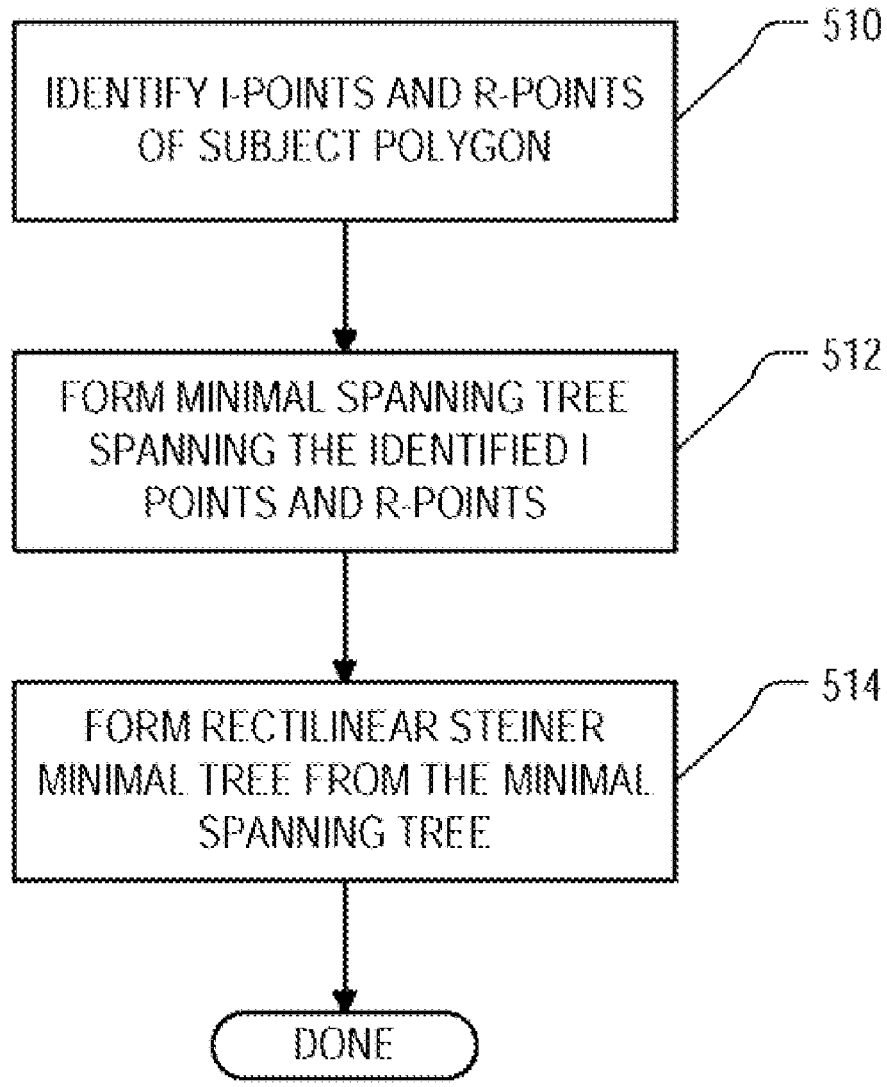

FIG. 5 illustrates a preferred method for developing the Partition Tree, (step 414 in FIG. 4). It comprises a two-step process of first forming a Minimal Spanning Tree connecting all the I-points and R-points, and then constructing a rectilinear Steiner Minimal Tree from the Minimal Spanning Tree. Thus in step 510, all of the I-points and R-points of the starting polygon are identified. As mentioned, the I-points are all the inflection vertices of the starting polygon, and in the polygon 100 in FIG. 1A they are a, b, c, d, e, f, g, h and i. The R-points are identified by drawing cutting rays from every I-point in the two rectilinear directions across the interior of the polygon. The R-points are then the intersection of these cutting rays with the nearest polygon boundary, excluding intersections which are already designated as I-points. The R-points of polygon 100 are identified in FIG. 1A as j, k, l, m, n, o, p, q, r, u and v, and are shown in the figures with solid dots.

In step 512, a Minimal Spanning Tree is constructed, spanning all the identified I-points and R-points. Preferably this tree is a Spanning Tree which minimizes the sum of the L1 lengths of all its edges. A Minimal Spanning Tree on the polygon 100 is shown in FIG. 1D. An efficient algorithm is described hereinafter for constructing such a Minimal Spanning Tree. (Edge ao is illustrated in an offset manner in the figure, but this is only for clarity of illustration. In actuality it is a straight line segment from I-point a to R-point o, and coincides in parts with line segments ae and ei.)

In step 514, the Minimal Spanning Tree is converted to a variant rectilinear Steiner minimal tree. The sense in which this tree is "minimal" depends on the embodiment, but preferably a cost function is defined as described hereinafter and it is this cost function which is minimized. Preferably the construction of the variant Steiner minimal tree is constrained in two respects: first, although the tree is rectilinear, it does not include any L-shaped edges (no Steiner points of degree 2); and each I-point has at least one edge that does not completely overlap the polygon boundary. A rectilinear Steiner minimal tree on the polygon 100 is illustrated in FIG. 1F. It can be seen that one Steiner point S has been added, and it is of degree 3. It can be seen also that each of the I-points has at least one cut-ray connected to it. An efficient algorithm is described hereinafter for constructing such a rectilinear Steiner minimal tree from a Minimal Spanning Tree.

Figure 6:
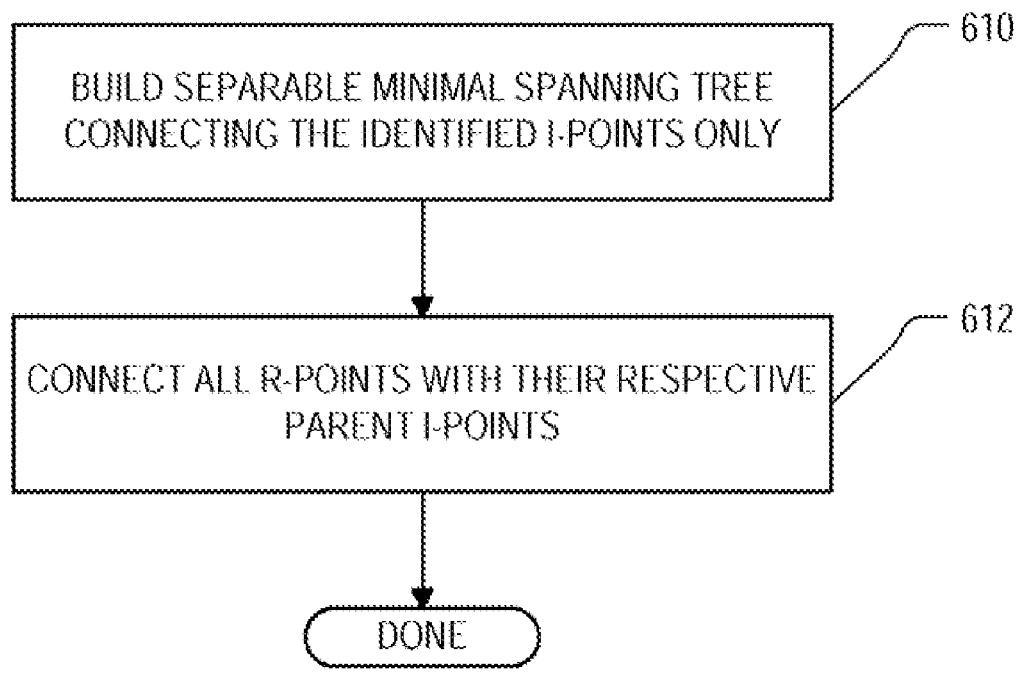

FIG. 6 is a flow chart of a method for constructing the Minimal Spanning Tree (step 512). It comprises a step 610 of building a Separable Minimal Spanning Tree on only the I-points, and then a step 612 of connecting all the R-points with their respective parent I-points. A separable tree is used in step 610 primarily to enable use of a highly efficient algorithm for converting the Spanning tree to a Steiner tree. In another embodiment, the Minimal Spanning Tree constructed in step 610 need not be separable. The tree in step 610 is constructed only on the I-points, because not all the R-points will be included in the final MPT, and it is difficult to determine during the construction of the SMST which R-points to include and which to omit. Instead it is preferred to leave it to the enumeration stage (discussed hereinafter with respect to FIG. 9) to determine which R-edges to include and which to remove. In another embodiment, however, steps 610 and 612 can be combined into a single algorithm that builds the separable minimal spanning tree connecting all the I-points and R-points, with other means implemented to ensure that appropriate R-points are removed.

Note that after the R-points are connected in step 612, the resulting Spanning tree is still a minimum spanning tree (given the above constraint). The reason is because the constructed partition tree suggests polygon partitioning cut lines. Hence as one of the partition's basic requirements, any edge with an R-point as one end point can only have the other end point be that R-point's parent I-point. Therefore, R-points can only be connected to the spanning tree on I-points by directly connecting to their parent I-points respectively. Consequently, the resulting tree completely connects all the I-points and R-points, and is minimal. The separable quality of the Minimum Spanning Tree after step 610, though, is not necessarily maintained after the R-points are connected in step 612. This can cause the preferred algorithm used to convert the Spanning tree to a Steiner tree, described hereinafter, to generate undesirable redundant edges. As explained below, an additional step of removing redundant edges is performed after the conversion in order to correct for this issue.

Figure 1C:
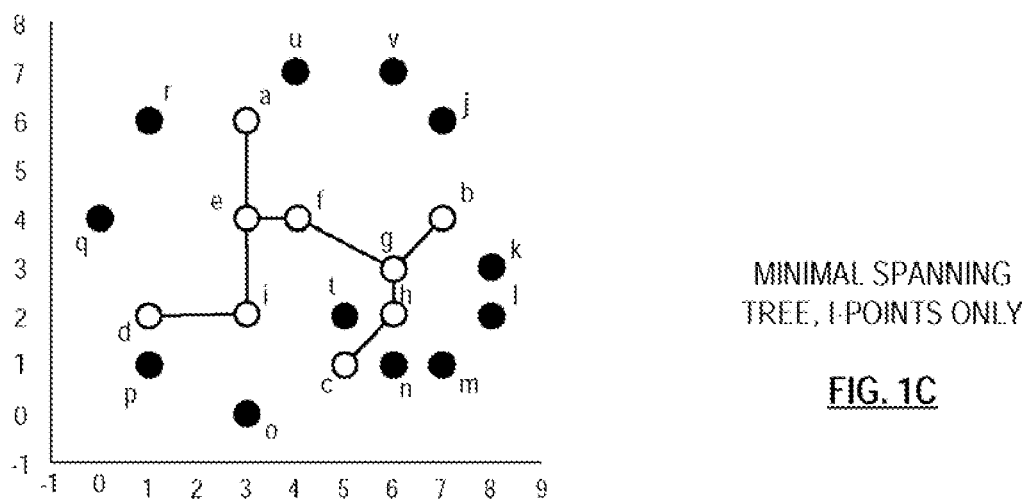
Figure 1D:
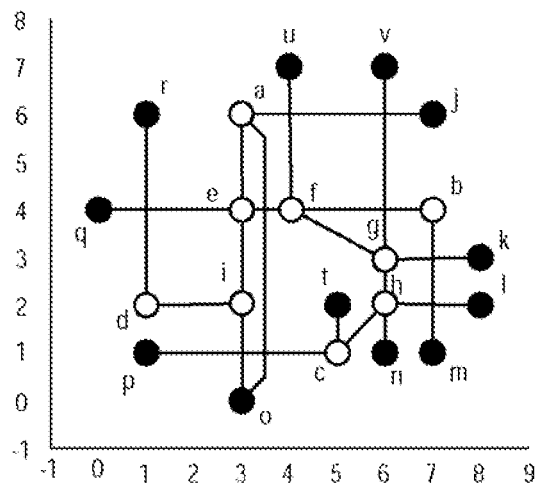

FIG. 1C illustrates a Separable Minimal Spanning Tree on only the I-points of polygon 100, after step 610. As mentioned previously, FIG. 1D illustrates the tree after the R-points have been connected in step 612.

Figure 7:
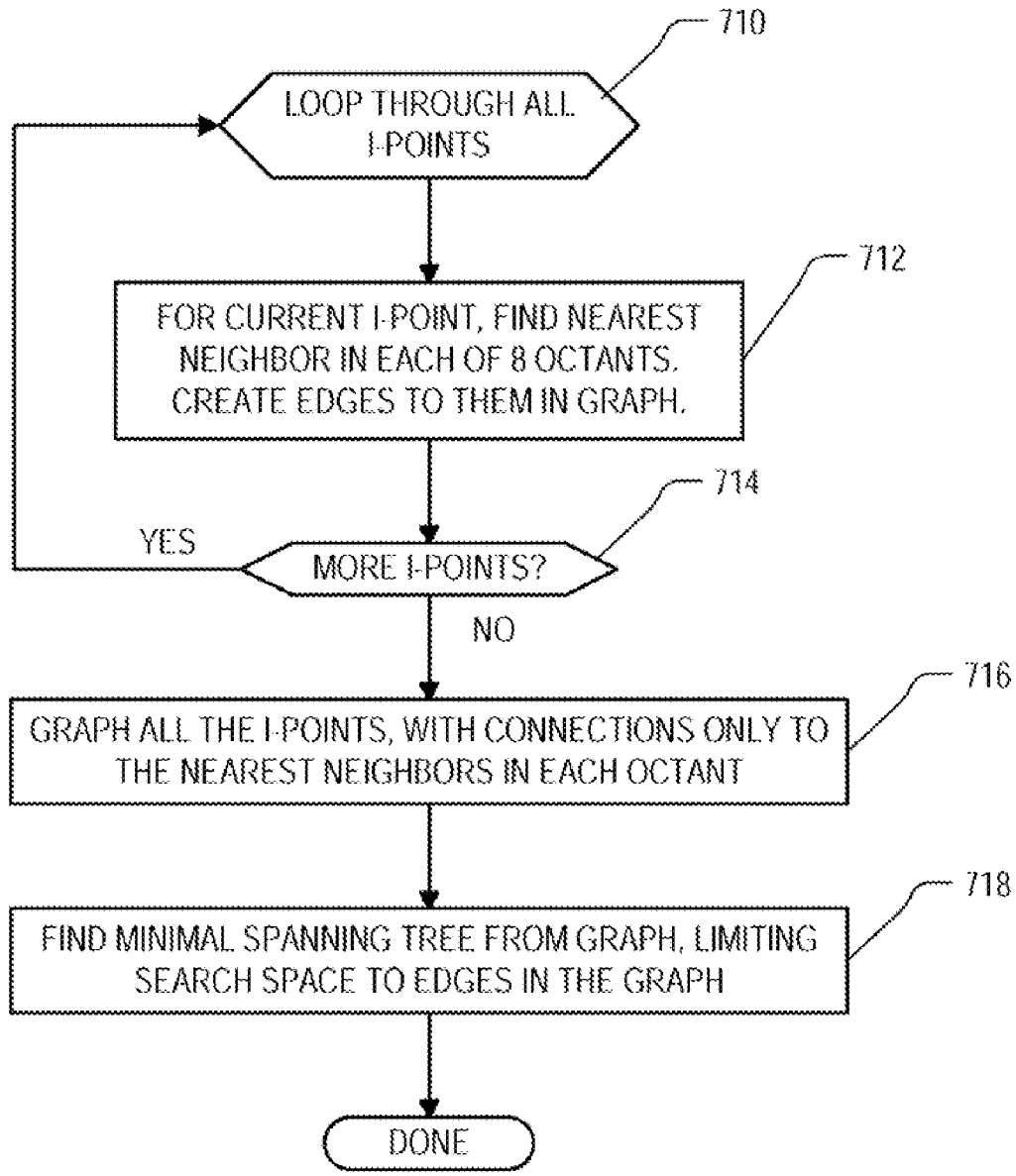

FIG. 7 is a flow chart of a preferred algorithm for step 610 of building a separable minimal spanning tree connecting the I-points. The algorithm roughly follows L. J. Guibas and J. Stolfi, "On computing all northeast nearest neighbors in the L1 metric." Information Processing Letters, 17:219-223 (1983), incorporated herein by reference. As shown in FIG. 7, the algorithm begins in step 710 by looping through all of the I-points. In step 712, for the current I-point, the nearest neighboring I-point is found in each of the 8 octants centered at the current I-point. Nearness is measured here by L1 distance. A cost function could be applied here if desired, but in the present embodiment it is not. In step 714 it is determined whether all the I-points have been processed, and if not, the flow returns to step 710 to consider the next I-point.

If in step 714 there are no more I-points to consider, then in step 716, all the I-points are entered on a graph G, with connections drawn to only the nearest neighbors in each octant. FIG. 1B illustrates such a graph for polygon 100, but for clarity of illustration, only the connections from I-points a and b are shown. Specifically, from I-point a, and using compass directions to identify octants, it can be seen that point b is the nearest neighbor in the ESE octant, point f is the nearest neighbor in the SSE octant. Since in FIG. 1B an octant boundary is considered part of the clockwise-adjacent octant, point e is the nearest neighbor in the SSW octant. (Another embodiment could consider instead an octant boundary to be part of the counter-clockwise-adjacent octant.) Similarly, from point b, point h is the nearest neighbor in the SSW octant and point g is the nearest neighbor in the WSW octant. Point a is the nearest neighbor in the WNW octant.

Once connections are made to the nearest neighbors in each I-point's octant, then in step 718 the minimal spanning tree is found using a conventional spanning tree optimization algorithm and limited to the search space defined by the connections drawn in step 716. The preferred algorithm roughly follows the PRIM or Kruskal algorithms described in Thomas Cormen, Charles Leiserson and Ronald Rivest, "Introduction to Algorithms", Chapter 24, pp. 498-511 (McGraw-Hill, 1990), incorporated herein by reference. The preferred algorithm operates by first initializing a spanning tree structure to a set with an arbitrary node (I-point). Next, find the smallest-cost edge from graph G that has one endpoint already in the tree structure and one not, and add to the tree structure both that edge and the endpoint not previously in the tree. Repeat the latter step iteratively until all the edges and points from Graph G have been entered into the tree. The resulting tree structure is then a minimal spanning tree spanning all the I-points of the starting polygon. As mentioned, FIG. 1C shows the result of this step on the polygon 100. By carefully formulating the edge cost, the constructed minimal spanning tree can be separable as well. For example, one way preferably adopted is the cost suggested in "New Algorithms for Rectilinear Tree Problem" (by J. M. Ho, G. Vijayan, and C. K. Wong, in IEEE Transaction on Computer-Aided Design, Vol 9, No. 2, 1990), incorporated by reference herein, in which the cost between node i and j is given by cost $(i,j)=\{L1(i,j), -|y(i)-y(j)|, -\max(x(i),x(j))\}$. That is, the difference of the cost is first judged by their L1 distance, and if equal then by the distance in the Y direction, and if still equal then by the X-coordinates of the two end points.

Figure 8:
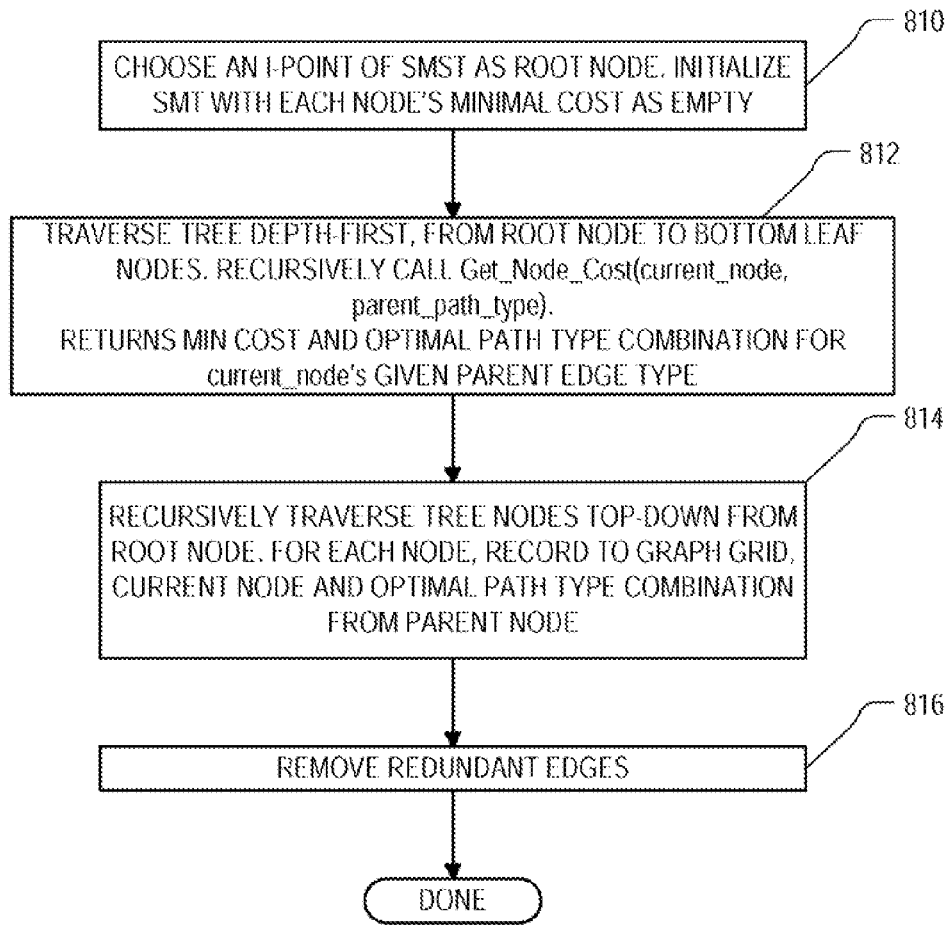
Figure 9:
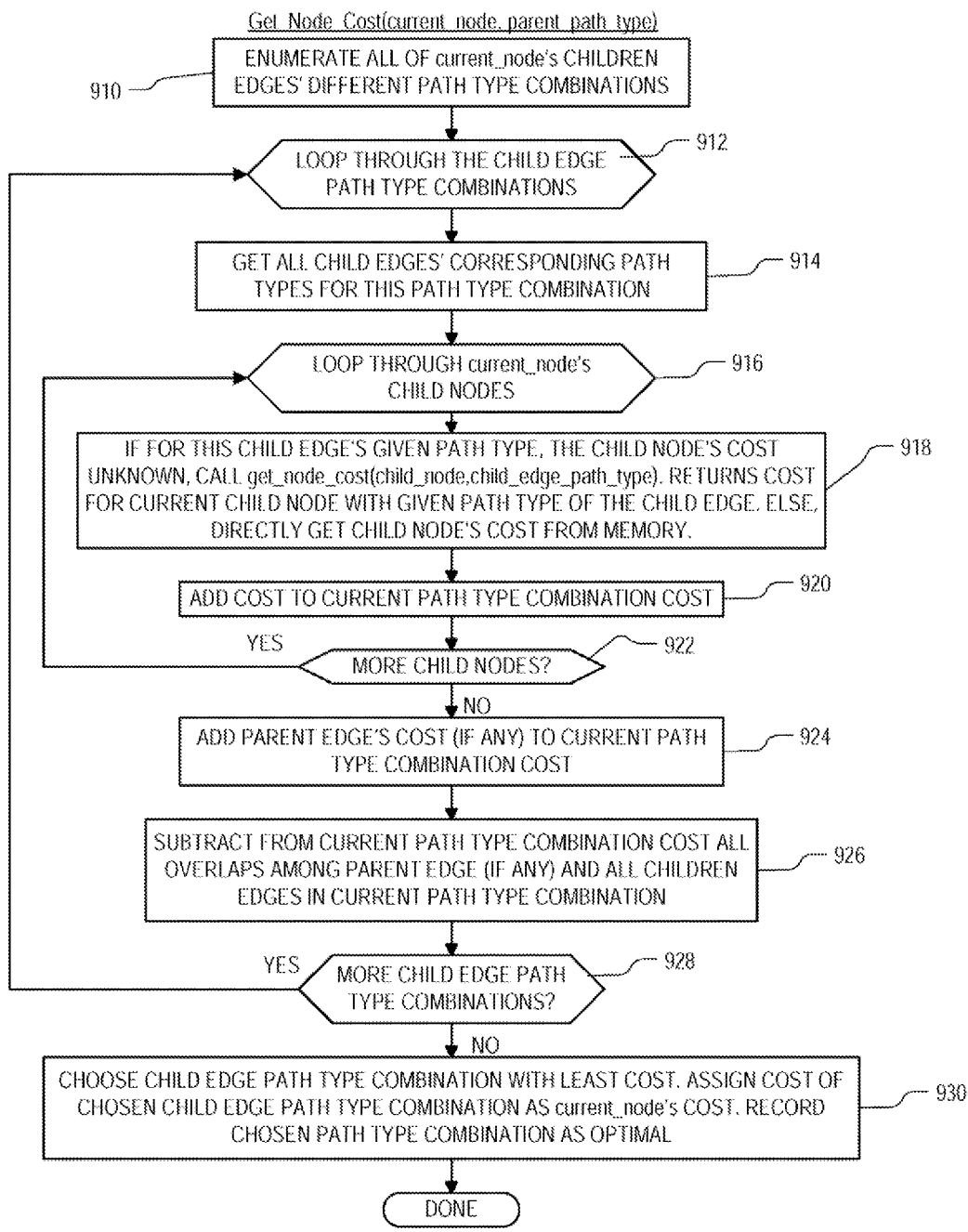
Figure 10:
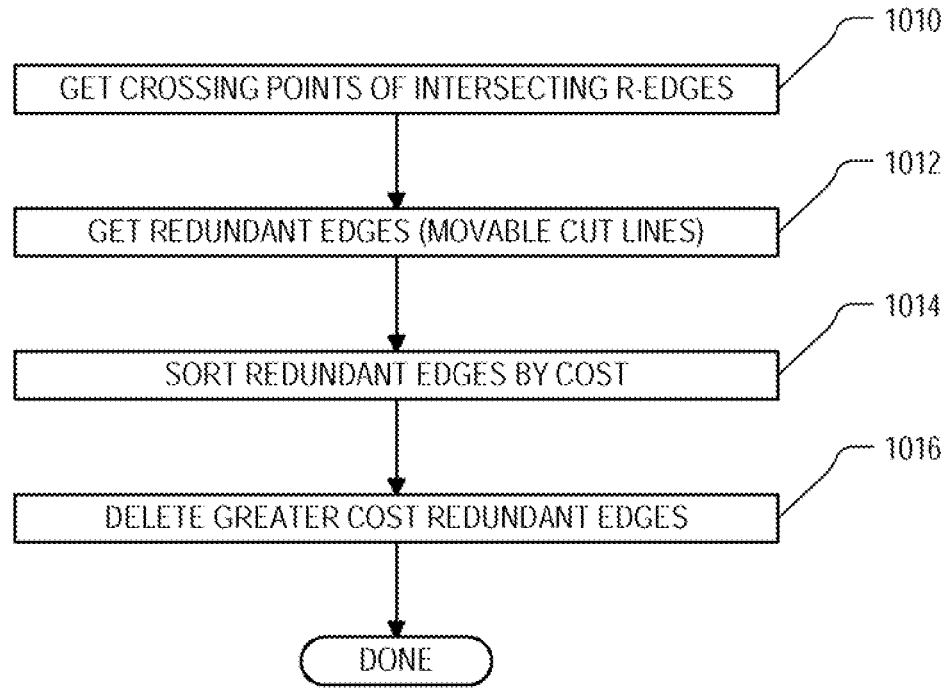

Returning to FIG. 5, after the minimal spanning tree spanning the I-points and R-points is found (step 512), a rectilinear Steiner minimal tree is formed from the minimal spanning tree (step 514). FIGS. 8-10 set forth an algorithm for accomplishing step 514. The algorithm is based on enumerating all the "path type combinations" that are possible for connecting each node of the tree to its child nodes, and traversing the tree recursively to choose the least cost combination at each level of the hierarchy. The property of separability in the minimal spanning tree guarantees that the sequence in which paths are optimized will not affect the result. In addition, since the bounding boxes of no two non-adjacent edges touch or intersect each other, the processing of the spanning tree into a Steiner tree can be done level by level, from root node to leaf nodes, without any need to consider cross-level nodes. Hence the processing complexity can be linear to the number of spanning tree edges. The minimal spanning tree found in step 512 is not necessarily completely separable, but as mentioned, the redundant edges that this deficiency can produce in the resulting Steiner minimal tree are removed later.

Referring to FIG. 8, in step 810, the Steiner Minimal Tree (SMT) is initialized with the full minimal spanning tree found in step 512. All the I-nodes and all the R-nodes, are present, as well as all the connections between each R-node and its parent I-node. Any I-point is chosen as the root node of the SMT. For example, in FIG. 1D, I-point f might be chosen as the root node. It can be seen from FIG. 1D that node f has child nodes b, e, g and u. Node e in turn has child nodes a, i and q, and so on. Also in step 810, each node of the tree is initialized to have a null minimal cost.

In step 812, a recursive routine Get_Node_Cost(current_node, parent_path_type) is called from the root node to the bottom leaf nodes. The tree is traversed depth-first. In step 812 the root node is provided for the current_node, and null is provided for the parent_path_type because the root node has no parent node. The Get_Node_Cost routine returns both the minimal cost of the current_node and the optimal path type combination for the current_node's children edges, given that the parent edge of the current_node has the given path type. Once this routine returns at root node, an optimal tree has already been found.

FIG. 9 is a flowchart of the Get_Node_Cost(current_node, parent_path_type) routine. It begins in step 910 by enumerating all of the path type combinations from current_node to its child nodes. The path type combinations from current_node to its children provide options for several different characteristics. For a child edge that connects to an R-point, the two possible path types are "present" or "absent". If present, the R-point will be connected. If absent, then the R-point will not be connected and hence is eliminated. For a child edge that connects to another I-point, the two possible path types are "lower-L" and "upper-L". This is because the desired SMT is rectilinear, whereas the edges in the Minimal Spanning Tree can be diagonal. An upper-L path type proceeds horizontally from the upper node of the connected pair, to a corner, then vertically to the lower node of the pair, whereas a lower-L path type proceeds vertically from the upper node of the connected pair, to a corner, then horizontally to the lower node of the pair. Thus for I-point f in FIG. 1D, there are four child nodes b, e, g and u. Among them, b, e, g are I-points, and u is an R-point. Each of the child edges from f, fb, fe, and fg can have path type "lower-L" or "upper-L". The child edge fu can have path type "present" or "absent". Hence the available path type combinations include combinations in which the paths to child nodes b, e, g and u respectively are: (upper-L, upper-L, upper-L, present), (upper-L, upper-L, upper-L, absent), (upper-L, upper-L, lower-L, present), and so on through all 16 combinations. Table I sets forth the 16 path type combinations from parent point f to its child nodes.

TABLE I

| Combo. # | fb/fe/fg: 0 = upper-L, 1 = lower-L fu: 0 = absent, 1 = present | | | |
|---|---|---|---|---|
| | fb | fe | fg | fu |
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

Of the above 16 path type combinations, the search space can be substantially reduced by applying some constraints. The first two of these constraints are appropriate for making the resulting partition tree directly applicable for partitioning the starting polygon, and therefore are not generally found in most typical tree optimization algorithms.

First, each I-point must have exactly one cut-state tree edge unless it has two chords (connected to other I-points). Stated differently, if an I-point has two children that are R-points, exactly one of them must be connected in the SMT. All the path combinations in which the paths to both are absent can be eliminated from the search space, as can all the path type combinations in which the paths to both are present. According to this constraint, in Table I, among all the combinations for the path types of all of f's child edges in the example of FIG. 1D, the combination 0, 2, 4, 6, 9, 11, 13, 15 can be eliminated.

Second, no part of an SMT tree edge can lie outside the polygon. Thus path type combinations in which an edge crosses a notch in the outer boundary of the starting can be eliminated, as can path type combinations which cross a hole in the polygon. Also, if an edge in the spanning tree is not horizontal or vertical (i.e. it is a diagonal edge), the path type for it in the Steiner tree cannot lie entirely on boundaries of the starting polygon. Path type combinations that violate that rule can be eliminated from search space as well.

Third, if two path combinations are identical then one can be eliminated from the search space. This may occur, for example, where a child node has either the same X-position or the same Y-position as its parent. In such a case the upper-L option to the child node and the lower-L option to that child node coincide. Where this occurs, all combinations which call for the lower-L option for the path to that child node can be eliminated from the search space. (In a different embodiment the upper-L options can be eliminated instead.) In the example of FIG. 1D, child nodes b, e and u each share either an X-position or a Y-position with parent node f. In Table I, therefore, all of the combinations can be eliminated from the search space except for combinations 12, 13, 14 and 15.

The search space for child path types for parent node f can therefore be reduced to only the combinations in Table II after the above three constraints are applied. This means that f is connected to e and b, but is not connected to u. We therefore need only to choose between fg path type being "lower-L" and "upper-L" for the smaller total cost.

TABLE II

| | fb/fe/fg: 0 = upper-L, 1 = lower-L fu: 0 = absent, 1 = present | | | |
|---|---|---|---|---|
| Combo. # | fb | fe | fg | fu |
| 12 | 1 | 1 | 0 | 0 |
| 14 | 1 | 1 | 1 | 0 |

After all of the path type combinations from current_node to its child nodes have been enumerated, then in step 912 an outer loop is begun to iterate through all of them. In step 914, for the current selected path combination, all the child edges corresponding path types are obtained. In step 916 an inner loop is begun to iterate through all of current_node's child nodes. For each child edge, in step 918, the Get_Node_Cost (current_node, parent_path_type) routine of FIG. 9 is first called recursively to determine the minimum cost for the current child node using the current path type to the current child node that is given by the current path type combination. (Preferably this minimum cost value is cached so that it need not be recalculated repeatedly.) In step 920 the minimum cost so obtained is added to the current path type combination cost variable, and in step 922 the flow loops back to step 916 to determine the minimum cost for the next child node using the next child edge's current path type. After all the child nodes of current_node have been traversed, the cost variable for the current path type combination contains the minimum cost of the current child edge path type combination.

In step 924 the parent edge's cost (if any) is also added to the minimum cost of the current child edge path type combination. The parent edge type was provided as the second argument to the Get_Node_Cost(current_node, parent_path_type) routine. If the parent_path_type was null, as during the iteration of Get_Node_Cost(current_node, parent_path_type) called from the root node in step 812, this step 924 is skipped. Next, in step 926, all the overlaps among the current_node's parent edge (if any) and all children edges in the current path type combination. The cost of these overlaps has been double-counted, so these are now subtracted once from the minimum cost of the current child edge path type combination. In step 928, if there are more child edge path type combinations to consider, flow returns to step 912 to calculate the minimum cost of the next child edge path type combination. In step 930, after the minimum costs of all the child edge path combinations have been calculated, the child edge path type combination with the least cost is chosen. The chosen path type combination is recorded as optimal, and the cost is returned from the Get_Node_Cost(current_node, parent_path_type) routine as current_node's minimum cost. Due to the separability property of the Minimal Spanning Tree, the enumeration, cost evaluation, and edge overlaps for a given tree node need only consider a current tree node's parent edge and its children edges. It is not necessary to consider grandparents or higher generations, or uncles, or cousins. As mentioned, the Minimal Spanning Tree resulting from step 512 is not entirely separable, but to the extent it is not, the artifacts created in the rectilinear Steiner minimal tree are subsequently removed.

Thus, returning to FIG. 8, as previously set forth, step 812 yields the optimal path type combination for the root node's children edges. Similarly, the optimal path type combination for all the nodes in the tree have also been recorded. To form the SMT, therefore, step 814 recursively traverses all the tree nodes, top-down from the root node. For each node, step 814 records to a graph grid both the current node and the optimal path type combination from the current node to each of its children. As mentioned, if the optimal path type combination from any node dictates the absence of any connection to an R-point child of that node, the R-point is eliminated and not recorded to the graph grid. Additionally, for any L-shaped path, the corner of the L is recorded to the graph grid as a Steiner point (unless it coincides with another node written to the graph grid). The final rectilinear SMT then is made up of the MST nodes recorded on the graph plus the set of optimal path type combinations.

Figure 1E:
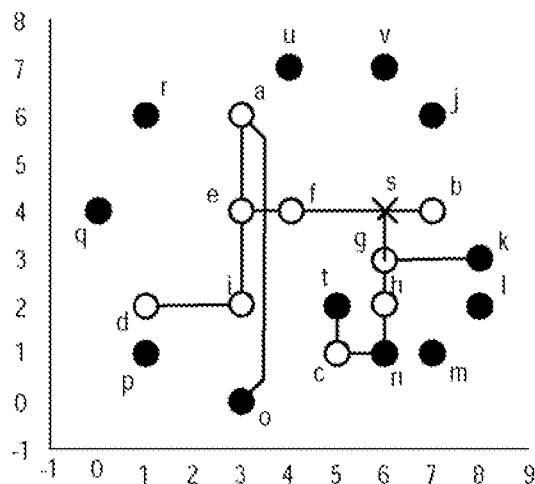
Figure 1F:
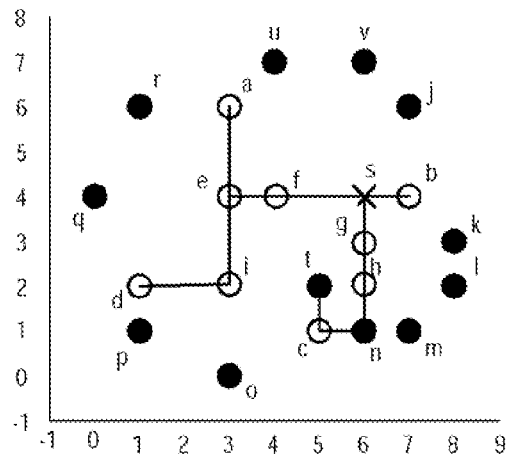
Figure 1G:
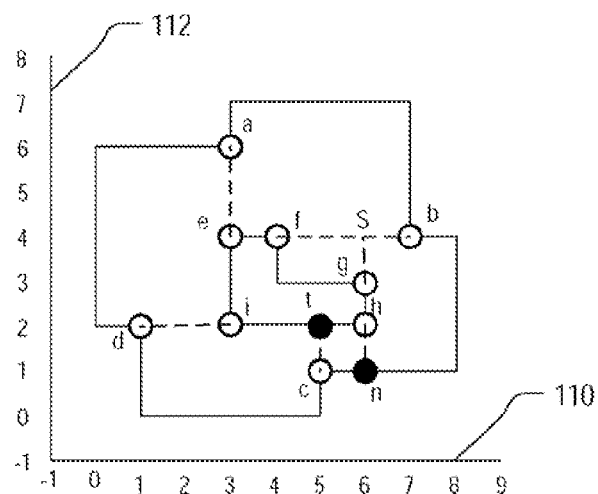
Figure 11:
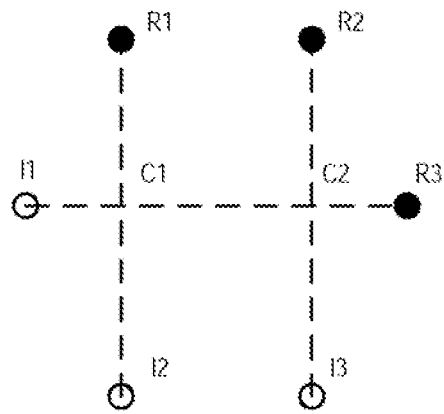
FIG. 11 illustrates a portion of a Steiner tree.

Step 816 then removes any redundant edges in the SMT. FIG. 10 is a detail of step 816. First, in step 1010, any intersecting R-edges are identified and their crossing points are obtained. In the tree illustrated in FIG. 11, for example, R-edges 12-R1 and 13-R2 each cross R-edge 11-R3 at respective crossing points C1 and C2. In step 1012, all the redundant edges are identified. These are "moveable", in the sense that they can be moved in a direction perpendicular to the orientation of the edge, without changing the edge cost, thus the tree cost, until it hits the polygon boundary. In the example of FIG. 1E, both edges io and gk are moveable, and in FIG. 11, edge C1-C2 is moveable. Edge io is redundant because it can be moved all the way to the left until it coincides with a segment of the starting polygon boundary, or all the way to the right until it is in-line with cut-line ct. Edge gk is redundant because it can be moved all the way upward until it is in-line with cut-line bf or all the way downward until it is in-line with cut-line cn.

In step 1014 the redundant edges are sorted by cost. The cost function used here is similar to the cost function used in step 920 and 924. In step 1016 the greater cost redundant edges are deleted from the SMT. Edges are removed in cost order, since removing one movable edge may cause another originally movable edge to no longer be movable. Movable edges are removed one by one in the sorted list from the greatest cost to the least. At this point the resulting SMT constitutes the final Partition Tree for the starting polygon (step 414), and the edges of the SMT can be applied as cut-lines to optimally partition the starting polygon (step 416).

Data Structures

In an embodiment, a tree node in the Minimal Spanning Tree resulting from step 512 (FIG. 5) is a data structure in memory having a type called MSTTreeNode, and which includes the following fields:

vertex: the pointer that points to the vertex information of this tree node, such as x, y coordinates, the pointers to previous and next vertices on the polygon boundary along anti-clockwise direction, and so on.

sons[ ]: array of pointers, each of which points to a child node (of MSTTreeNode type) of this tree node. The length of the array is the same as the number of child nodes of this node.

sonNum: number of this node's children nodes in the spanning tree.

parentPathStatus[2]: the path status for the parent edge being each of the 2 different path types. The 1st field xxx[0] is the status for path type being "lower L" type. The 2nd field xxx[1] is the status for path type being "upper L" type. The status value of a particular path type can be one of the following: has portion outside the polygon, completely on polygon boundary, completely inside polygon, or part inside polygon, part on boundary, and so on.

costs[ ]: the array of the minimal costs for this node associated with each of the parent path's different path type. The array length is same as the number of different path types of the node's parent edge.

subRST[ ]: the array of pointers, each of which points to a sub-tree (in RSTNode type) rooted at this current node with this node's parent edge being one of the different path types. This array stores, for each different path type of current node's parent edge, the optimal combination of its children nodes' path types that gives minimal cost. For example, for current node's parent edge being path type (i), cost[i] stores the minimal cost, subRST[i] points to the sub-tree rooted at this code in which the children nodes' path types are in the optimal combination that gives minimal cost "cost[i]".

Also in an embodiment, a tree node in the rectilinear Steiner Tree resulting from step 514 (FIG. 5) is a data structure in memory having a type called RSTNode, and which includes the following fields:

vertex: the pointer that points to the vertex information of this tree node, such as x, y coordinates, the pointers to previous and next vertices on the polygon boundary along anti-clockwise direction, and so on.

spanNode: a pointer that points to the spanning tree node (in MSTTreeNode type) that is associated with this rectilinear Steiner Tree tree node.

thisLayout: the path type of the parent edge from current tree node to its spanning tree parent tree node.

sonNum: the number of current node's children nodes.

sons[ ]: array of slot IDs, each of which represents the direction from current tree node to one of its child nodes in the rectilinear Steiner tree. The length of the array is sonNum. The slot ID value, which means the direction, can be EAST, WEST, NORTH, or SOUTH.

slots[ ]: array of real child node pointers (pointing to objects of type RSTNode) that is in each of the directions. If in direction "i" (which means slot ID=i, 0 means EAST, 1 means SOUTH, . . . etc) there is a child node of this current node directly connected to this node, then slot[i] stores the pointer to that child node. If in that direction there is no child node connected, it stores NULL, an empty pointer.

Cost Functions

In the above-described algorithm, cost functions are used during the conversion of the minimal spanning tree to the Steiner minimal tree, in steps 920 and 924 (FIG. 9), and again when sorting redundant edges in step 1014 (FIG. 10) for removal. A cost function, as the term is used herein, is a measure of how "good" any particular solution is considered—the lower the value of this function, the better the solution. A cost function is typically defined as the weighted sum of a plurality of factors which depend on the particular solution candidate. Any feature of the solution can be included in the cost function, and given whatever weight is desired for the particular application. For example, a feature that is considered more important can be given a greater weight in the cost function than a feature that is considered less important. If a feature can have a continuous range of values (such as total length of a particular candidate solution), then the value can be scaled, shifted and/or negated to give it appropriate influence in the cost function. If a feature has a binary value, indicating whether or not the feature is present in a particular candidate solution, the favored value can be given a zero or negative weight while the disfavored value can be given a positive weight so that its presence in a particular solution increases the cost of that solution. If the feature is a constraint (that is, a feature whose presence or absence is to be prohibited), then the disfavored value of the feature can be given a prohibitive weight (such as infinity). Alternatively, candidate solutions having the prohibited value for the constraint can be removed from the candidate set altogether without even considering the cost function (as is done for some features in the present embodiment, but eliminating certain candidates from the search space).

In the embodiments described herein, during the construction of the Steiner minimal tree, the cost function used in steps 920 and 924 is based primarily on L1 length of an edge, because it has been proved that minimization of the sum of the cut-lines of a polygon corresponds to optimization of the shapes of the rectangular sub-polygons of the partition. That is, the aspect ratios of the rectangles are optimally close to unity. But because a cost function is used in the present embodiment rather than purely total edge length, the construction of the Steiner minimal tree can also optimize for other considerations. In the present embodiment in particular discourages slivers and critical dimension (CD) slicing edges.

The critical dimension of a mask-making process is a line width, usually specified by the mask-making house, narrower than which the mask writing is deemed to be unreliable. In order to minimize the probability that narrower lines must be written, mask-making houses often discourage partitions that slice an already very narrow polygon along the lengthwise direction. More specifically, if the aspect ratio of a rectangle is very far from unity, and its length is greater than some maximum threshold, and its width is smaller than some minimum threshold, then a partition which requires splitting the rectangle along the long dimension is considered to be CD slicing and is discouraged.

A sliver, as previously mentioned and as used herein, is a small dimension figure that is difficult to print on a mask because of its narrowness relative to the resolution of the mask writing equipment. Not all slivers are problematical. Embedded slivers, which are slivers both of whose long sides are interior to the polygon, are acceptable whereas an edge sliver, at least one long side of which is on the polygon boundary, is problematical. If an edge sliver is unavoidable, then it is desirable to minimize the cumulative length of edges which create edge sliver regions.

The cost of an edge, as used for the Steiner minimal tree construction in FIG. 9 is of an edge is given by the L1 length of the edge plus a sliver_cost plus a CD_cost. The CD_cost is given by a CD_slicing flag multiplied by a CD_slicing weight. The CD_slicing_flag is 1 if the edge splits the critical dimension (according to the mask maker's definition), or 0 if it does not. The sliver_cost is the overlap_length multiplied by a sliver weight factor. The overlap_length is the length of the portion of the edge that has distance from a polygon boundary that is smaller than a predetermined sliver_width value. If an edge has several segments of intervals with distance from boundary smaller than sliver_width, then the overlap_length is the sum of all such these segment lengths.

In other embodiments, some of the considerations used in step 910 (FIG. 9) of the present embodiment for reducing the search space, can instead be incorporated into the cost function. These include such factors as a penalty for a completely on-boundary path; a penalty for an L-shaped path (i.e. a rectilinear path that creates a Steiner point of degree 2 rather than 3); and a penalty for solutions having two cuts from a single I-node. As mentioned, by using cost minimization rather than simply total tree edge length minimization, various optimization objectives can be incorporated directly into the optimization problem by including them in the cost function. Changing optimization objectives then becomes an easy task and does not imply changing algorithms.

It will be appreciated that it is possible to design an optimization function in which favored features increase rather than decrease its value, and for which the solution to be chosen is one with the maximum, rather than the minimum value. A duality exists between such maximized optimization functions and cost functions as described herein, such that for every such maximized optimization function, there is a corresponding cost function that accomplishes the same objective and will achieve the same result. For this reason, an embodiment which maximizes such an optimization function, also can be said to minimize a corresponding cost function (even though the cost function may not be explicitly set out in the embodiment).

Hardware Implementation

Figure 12:
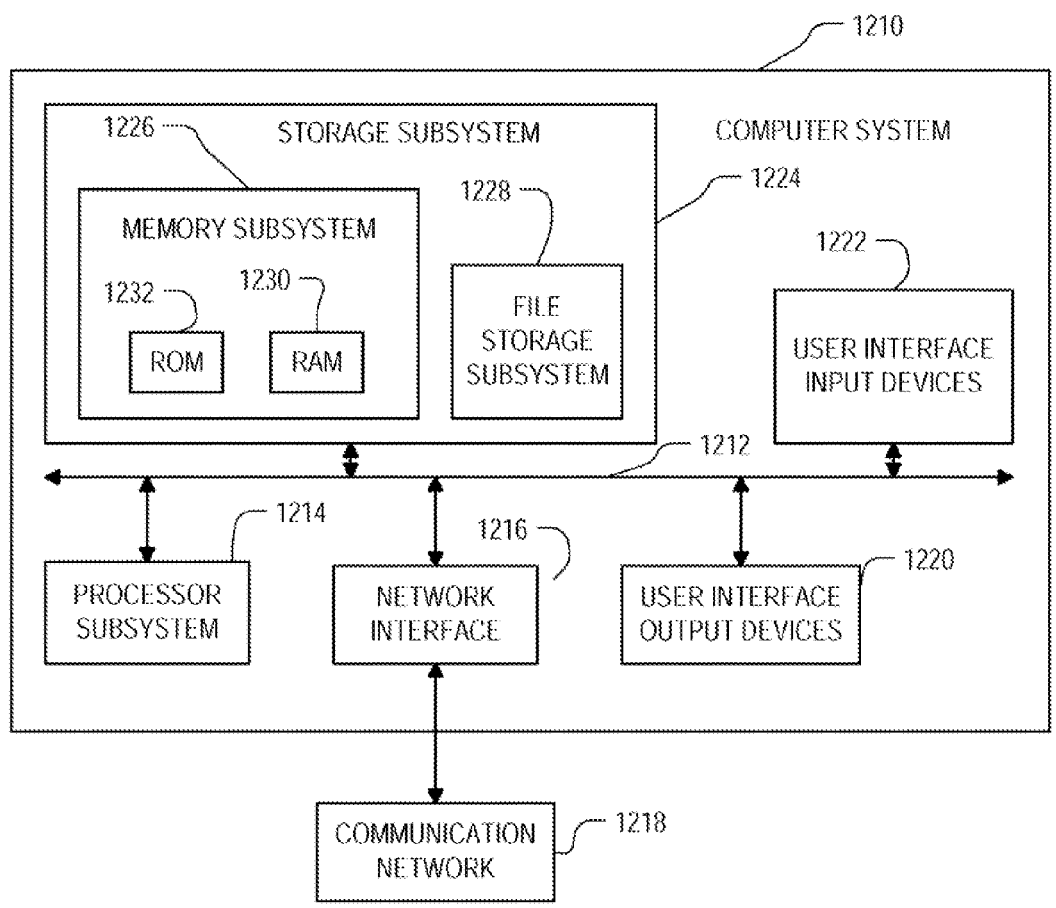
FIG. 12 is a simplified block diagram of a computer system 1210 that can be used to implement software for performing aspects of the present invention.

FIG. 12 is a simplified block diagram of a computer system 1210 that can be used to implement software for performing aspects of the present invention. While the flow chart figures set forth herein specify particular operations to be performed, it will be appreciated that in a computer and software implementation each flow chart step actually causes the computer system 1210 to operate in the specified manner.

Computer system 1210 typically includes a processor subsystem 1214 which communicates with a number of peripheral devices via bus subsystem 1212. These peripheral devices may include a storage subsystem 1224, comprising a memory subsystem 1226 and a file storage subsystem 1228, user interface input devices 1222, user interface output devices 1220, and a network interface subsystem 1216. The input and output devices allow user interaction with computer system 1210. Network interface subsystem 1216 provides an interface to outside networks, including an interface to communication network 1218, and is coupled via communication network 1218 to corresponding interface devices in other computer systems. Communication network 1218 may comprise many interconnected computer systems and communication links. These communication links may be wireline links, optical links, wireless links, or any other mechanisms for communication of information. While in one embodiment, communication network 1218 is the Internet, in other embodiments, communication network 1218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1210 or onto computer network 1218.

User interface output devices 1220 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 1210 to the user or to another machine or computer system.

Storage subsystem 1224 stores the basic programming and data constructs that provide the functionality of certain embodiments of the present invention. For example, the various modules implementing the functionality of certain embodiments of the invention may be stored in storage subsystem 1224. These software modules are generally executed by processor subsystem 1214.

Memory subsystem 1226 typically includes a number of memories including a main random access memory (RAM) 1230 for storage of instructions and data during program execution and a read only memory (ROM) 1232 in which fixed instructions are stored. File storage subsystem 1228 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1228. The host memory 1226 contains, among other things, computer instructions which, when executed by the processor subsystem 1214, cause the computer system to operate or perform functions as described herein. As used herein, processes and software that are said to run in or on "the host" or "the computer", execute on the processor subsystem 1214 in response to computer instructions and data in the host memory subsystem 1226 including any other local or remote storage for such instructions and data.

Bus subsystem 1212 provides a mechanism for letting the various components and subsystems of computer system 1210 communicate with each other as intended. Although bus subsystem 1212 is shown schematically as a single bus, alternative embodiments of the bus subsystem may use multiple busses.

Computer system 1210 itself can be of varying types including a personal computer, a portable computer, a workstation, a computer terminal, a network computer, a television, a mainframe, or any other data processing system or user device. Due to the ever changing nature of computers and networks, the description of computer system 1210 depicted in FIG. 12 is intended only as a specific example for purposes of illustrating the preferred embodiments of the present invention. Many other configurations of computer system 1210 are possible having more or less components than the computer system depicted in FIG. 12.

The present invention may be practiced as a method or device adapted to practice the method. The invention may be an article of manufacture such as media impressed with logic to carry out the steps of the polygon partitioning method when executed by a computer.

While the present invention has been described by reference to preferred embodiments and examples detailed above, it is understood that these examples are intended in an illustrative rather than in a limiting sense. Computer-assisted processing may be used to implement the described embodiments. Accordingly, the present invention may be embodied in methods for performing the specified steps, systems including logic and resources to carry out the specified steps, media impressed with logic to carry out the specified steps, data streams impressed with logic to carry out the specified steps, or computer-accessible services that carry out the specified steps. It is contemplated that modifications and combinations will readily occur to those skilled in the art, which modifications and combinations will be within the spirit of the invention and the scope of the following claims.

We claim as follows:

1. A method for mask data preparation, for use with a preliminary mask layout that includes a starting polygon, the starting polygon consisting of a plurality of boundary segments connecting pairs of starting polygon vertices, the starting polygon having an interior,
   wherein the vertices of the starting polygon include at least one I-point each having an interior angle strictly greater than 90 degrees, the method comprising:
   by a computer system, constructing a spanning tree connecting all the I-points of the starting polygon as well as all the R-points of the starting polygon, the R-points being all boundary of the starting polygon which do not coincide with a vertex, and which are disposed rectilinearly across the starting polygon interior from one of the I-points;
   traversing the spanning tree recursively according to the tree structure;
   in dependence upon the step of traversing, developing a rectilinear partition tree having a plurality of nodes and a plurality of edges connecting pairs of the nodes, the plurality of nodes including all I-points of the starting polygon, the plurality of edges including at least one connected to each of the I-points; and
   outputting a plurality of sub-polygons which collectively partition the starting polygon, all the sides of all of the sub-polygons lying on either a boundary of the starting polygon or an edge of the partition tree or both.

2. The method according to claim 1, wherein the plurality of nodes in the partition tree further includes at least one R-point.

3. The method according to claim 2, wherein at least one point on a boundary of the starting polygon which does not coincide with a vertex, and which is disposed rectilinearly across the starting polygon interior from one of the I-points, is not included in the partition tree.

4. The method according to claim 2, wherein for each given I-point of the starting polygon, if the given I-point has two R-points being points on the boundary of the starting polygon which do not coincide with a vertex or with each other, and which are disposed rectilinearly across the starting polygon interior from the given I-points, one of the R-points is included in the partition tree and the other is not.

5. The method according to claim 4, wherein the included R-point for each given I-point is connected directly in the partition tree to the given I-point.

6. The method according to claim 2, wherein no edge of the partition tree includes any portion exterior to the starting polygon.

7. The method according to claim 1, wherein the plurality of nodes in the partition tree further includes at least one Steiner point, the plurality of nodes not including any Steiner points of degree 2.

8. The method according to claim 1, wherein all of the sub-polygons are trapezoids.

9. The method according to claim 8, wherein all the sides of all of the sub-polygons, which sides lie in any part on one of the partition tree edges, are rectilinear.

10. The method according to claim 1,
    further comprising providing a predetermined cost function,
    wherein the plurality of nodes in the partition tree further includes at least one R-point,
    wherein the partition tree is a rectilinear Steiner tree,
    and wherein of all possible rectilinear Steiner trees that can be constructed connecting all of the I-points and R-points, the partition tree has the minimum cost according to the cost function.

11. The method according to claim 10, wherein each given one of the R-points in the tree is connected in the tree directly to an I-point disposed rectilinearly across the starting polygon interior from the given R-point.

12. The method according to claim 10, wherein the cost function is positively dependent upon the sum of the L1 edge lengths of the partition tree.

13. The method according to claim 10, wherein the cost function is positively dependent upon the total length of any non-embedded slivers produced by the partition tree.

14. The method according to claim 10, wherein the cost function disfavors those partition trees having edges that slice a critical dimension of the starting polygon.

15. The method according to claim 10, wherein the cost function disfavors those partition trees having edges that lie at least in part exterior to the starting polygon.

16. The method according to claim 10, wherein the cost function disfavors those partition trees having any Steiner points of degree 2 over those in which all Steiner points are of degree 3.

17. The method according to claim 10, wherein the cost function disfavors those partition trees which include two cuts from any single I-node.

18. The method according to claim 1, wherein constructing a spanning tree comprises constructing a separable minimal spanning tree connecting all the I-points; and
    connecting all the R-points to the separable minimal spanning tree.

19. The method according to claim 18, wherein constructing a separable minimal spanning tree comprises constructing a particular tree for which, of all possible separable trees that can be constructed connecting all of the I-points, the edges of the particular tree have the minimum total L1 length.

20. The method according to claim 1, wherein developing the partition tree comprises:
    forming a rectilinear Steiner tree wherein of all possible rectilinear Steiner trees that can be constructed using the I-points, R-points and edges of the spanning tree, the partition tree has the minimum cost according to a predetermined cost function; and
    removing redundant edges from the rectilinear Steiner tree.

21. The method according to claim 20, wherein constructing a spanning tree comprises constructing a separable minimal spanning tree connecting all the I-points; and
    connecting all the R-points to the separable minimal spanning tree.

22. The method according to claim 1, wherein developing a partition tree comprises:
    constructing a Steiner tree connecting all the I-points of the starting polygon as well as fewer than all the R-points of the starting polygon, the R-points being all points on a boundary of the starting polygon which do not coincide with a vertex, and which are disposed rectilinearly across the starting polygon interior from one of the I-points; and
    forming the partition tree in dependence upon the Steiner tree.

23. The method according to claim 1, wherein
    the spanning tree has a plurality of nodes and a plurality of edges connecting pairs of the nodes, the plurality of nodes including all I-points of the starting polygon, the plurality of edges including only edges that directly connect an I-point with either an R-point or another I-point.

24. The method according to claim 23, wherein developing the partition tree comprises:
constructing a minimal spanning tree in dependence upon the spanning tree; and
constructing the partition tree in dependence upon the minimal spanning tree.

25. The method according to claim 24, wherein the minimal spanning tree is one which minimizes the sum of the L1 lengths of all its edges.

26. A system for mask data preparation, for use with a preliminary mask layout that includes a starting polygon, the starting polygon consisting of a plurality of boundary segments connecting pairs of starting polygon vertices, the starting polygon having an interior,
wherein the vertices of the starting polygon include at least one I-point each having an interior angle strictly greater than 90 degrees, the system comprising:
means for constructing a spanning tree connecting all the I-points of the starting polygon as well as all the R-points of the starting polygon, the R-points being all points on a boundary of the starting polygon which do not coincide with a vertex, and which are disposed rectilinearly across the starting polygon interior from one of the I-points;
means for traversing the spanning tree recursively according to the tree structure;
means for developing, in dependence upon the means for traversing, a rectilinear partition tree having a plurality of nodes and a plurality of edges connecting pairs of the nodes, the plurality of nodes including all I-points of the starting polygon, the plurality of edges including at least one connected to each of the I-points; and
means for outputting a plurality of sub-polygons which collectively partition the starting polygon, all the sides of all of the sub-polygons lying on either a boundary of the starting polygon or an edge of the partition tree or both.

27. The system according to claim 26, wherein the plurality of nodes in the partition tree further includes at least one R-point.

28. The system according to claim 27, wherein for each given I-point of the starting polygon, if the given I-point has two R-points being points on the boundary of the starting polygon which do not coincide with a vertex or with each other, and which are disposed rectilinearly across the starting polygon interior from the given I-points, one of the R-points is included in the partition tree and the other is not,
and wherein the included R-point for each given I-point is connected directly in the partition tree to the given I-point.

29. The system according to claim 27, wherein no edge of the partition tree includes any portion exterior to the starting polygon,
wherein the plurality of nodes in the partition tree further includes at least one Steiner point, the plurality of nodes not including any Steiner points of degree 2.

30. The system according to claim 26, wherein all of the sub-polygons are trapezoids,
and wherein all the sides of all of the sub-polygons, which sides lie in any part on one of the partition tree edges, are rectilinear.

31. The system according to claim 26, for use further with a predetermined cost function,
wherein the plurality of nodes in the partition tree further includes at least one R-point,
wherein the partition tree is a rectilinear Steiner tree,
wherein each given one of the R-points in the tree is connected in the tree directly to an I-point disposed rectilinearly across the starting polygon interior from the given R-point,
and wherein of all possible rectilinear Steiner trees that can be constructed connecting all of the I-points and R-points, the partition tree has the minimum cost according to the cost function.

32. The system according to claim 31, wherein the cost function is positively dependent upon the sum of the L1 edge lengths of the partition tree.

33. The system according to claim 32, wherein the cost function is positively dependent upon the total length of any non-embedded slivers produced by the partition tree, and disfavors those partition trees having edges that slice a critical dimension of the starting polygon.

34. The system according to claim 26, wherein the means for constructing a spanning tree comprises means for constructing a separable minimal spanning tree connecting all the I-points and for connecting all the R-points to the separable minimal spanning tree,
and wherein the means for developing the partition tree comprises:
means for forming a rectilinear Steiner tree wherein of all possible rectilinear Steiner trees that can be constructed using the I-points, R-points and edges of the spanning tree, the partition tree has the minimum cost according to a predetermined cost function; and
means for removing redundant edges from the rectilinear Steiner tree.

35. The system according to claim 26, wherein the means for developing a partition tree comprises:
means for constructing a Steiner tree connecting all the I-points of the starting polygon as well as fewer than all the R-points of the starting polygon, the R-points being all points on a boundary of the starting polygon which do not coincide with a vertex, and which are disposed rectilinearly across the starting polygon interior from one of the I-points; and
means for forming the partition tree in dependence upon the Steiner tree.

36. The system according to claim 26, wherein the spanning tree has a plurality of nodes and a plurality of edges connecting pairs of the nodes, the plurality of nodes including all I-points of the starting polygon, the edges of the spanning tree including only edges that directly connect an I-point with either an R-point or another I-point.

37. The system according to claim 36, wherein the means for developing the partition tree comprises:
means for constructing a minimal spanning tree in dependence upon the spanning tree; and
means for constructing the partition tree in dependence upon the minimal spanning tree.

38. The system according to claim 37, wherein the minimal spanning tree is one which minimizes the sum of the L1 lengths of all its edges.

* * * * *

UNITED STATES PATENT AND TRADEMARK OFFICE
CERTIFICATE OF CORRECTION

PATENT NO. : 8,151,236 B2
APPLICATION NO. : 12/017025
DATED : April 3, 2012
INVENTOR(S) : Su et al.

It is certified that error appears in the above-identified patent and that said Letters Patent is hereby corrected as shown below:

At column 19, claim number 1, line number 14, add the phrase "points on a" as follows:

being all --points on a-- boundary of the starting polygon which do not

Signed and Sealed this
Fifteenth Day of May, 2012

David J. Kappos
*Director of the United States Patent and Trademark Office*